United States Patent
Mandal et al.

(10) Patent No.: US 10,043,962 B2
(45) Date of Patent: Aug. 7, 2018

(54) THERMOELECTRIC COOLING USING THROUGH-SILICON VIAS

(71) Applicant: GLOBALFOUNDRIES INC., Grand Cayman (KY)

(72) Inventors: Sudeep Mandal, Bangalore (IN); Richard S. Graf, Gray, ME (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 107 days.

(21) Appl. No.: 15/147,595

(22) Filed: May 5, 2016

(65) Prior Publication Data

US 2017/0324015 A1 Nov. 9, 2017

(51) Int. Cl.
| | | |
|---|---|---|
| *H01L 35/30* | (2006.01) | |
| *H01L 35/32* | (2006.01) | |
| *H01L 35/10* | (2006.01) | |
| *H01L 23/38* | (2006.01) | |
| *H01L 35/34* | (2006.01) | |

(52) U.S. Cl.
CPC .............. *H01L 35/10* (2013.01); *H01L 23/38* (2013.01); *H01L 35/34* (2013.01)

(58) Field of Classification Search
CPC ..................... H01L 35/00–35/34; H01L 27/16
USPC .................................................. 136/200–242
See application file for complete search history.

(56) References Cited

U.S. PATENT DOCUMENTS

| | | |
|---|---|---|
| 6,121,539 A | 9/2000 | Johnson et al. |
| 6,410,971 B1 | 6/2002 | Otey |
| 7,893,529 B2 | 2/2011 | Hsu et al. |
| 8,933,562 B2 | 1/2015 | Kinser et al. |
| 2007/0290287 A1* | 12/2007 | Freedman ............... B82Y 30/00 257/443 |
| 2008/0000511 A1* | 1/2008 | Kuroyanagi ............ H01L 35/30 136/201 |
| 2009/0243078 A1* | 10/2009 | Lim .................... H01L 23/4334 257/690 |
| 2011/0042805 A1* | 2/2011 | Yu .......................... H01L 35/32 257/737 |
| 2011/0291269 A1* | 12/2011 | Griebenow ............... G06F 1/20 257/737 |
| 2014/0264339 A1 | 9/2014 | Kim et al. |

\* cited by examiner

*Primary Examiner* — Bach T Dinh
(74) *Attorney, Agent, or Firm* — Thompson Hine LLP; Anthony Canale

(57) ABSTRACT

Structures that include thermoelectric couples and methods for fabricating such structures. A device level and a back-end-of-line (BEOL) interconnect structure are fabricated at a front side of a substrate. A thermoelectric couple is formed that is coupled with the substrate. The thermoelectric couple includes a first through-silicon via extending through the device level and the substrate to a back side of the substrate, a second through-silicon via extending through the device level and the substrate to the back side of the substrate, an n-type thermoelectric pillar coupled with the first through-silicon via, and a p-type thermoelectric pillar coupled with the second through-silicon via. The BEOL interconnect structure includes a wire that couples the first through-silicon via in series with the second through-silicon via.

19 Claims, 3 Drawing Sheets

THERMOELECTRIC COOLING USING THROUGH-SILICON VIAS

BACKGROUND

The present invention relates to integrated circuits and semiconductor device fabrication and, more specifically, to structures that include one or more thermoelectric couples and methods for fabricating such structures.

Integrated circuits are heat-generators when powered and operating in a semiconductor package. Heat confined within the semiconductor package can cause temperature increases that may have an adverse effect on the functioning of integrated circuit devices and may even produce component failure. A semiconductor package can be cooled using a passive heat sink or other powered cooling mechanism.

Improved structures that include one or more thermoelectric couples and methods for fabricating such structures are needed.

SUMMARY

According to one embodiment of the present invention, a structure is formed using a substrate having a front side and a back side that is opposite from the front side. The structure includes a device level and a back-end-of-line (BEOL) interconnect structure at the front side of the substrate, as well as a thermoelectric couple coupled with the substrate. The thermoelectric couple includes a first through-silicon via extending through the device level and the substrate to the back side of the substrate, a second through-silicon via extending through the device level and the substrate to the back side of the substrate, an n-type thermoelectric pillar coupled with the first through-silicon via, and a p-type thermoelectric pillar coupled with the second through-silicon via. The BEOL interconnect structure includes a wire that couples the first through-silicon via in series with the second through-silicon via.

According to another embodiment of the present invention, a method includes forming a device level at a front side of a substrate that is opposite from a back side of the substrate, forming a first through-silicon via extending through the device level and the substrate to the back side of the substrate, forming a second through-silicon via extending through the device level and the substrate to the back side of the substrate, depositing an n-type thermoelectric pillar coupled with the first through-silicon via, depositing a p-type thermoelectric pillar coupled with the second through-silicon via, and forming a back-end-of-line (BEOL) interconnect structure at the front side of the substrate. The BEOL interconnect structure includes a wire that couples the first through-silicon via in series with the second through-silicon via.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
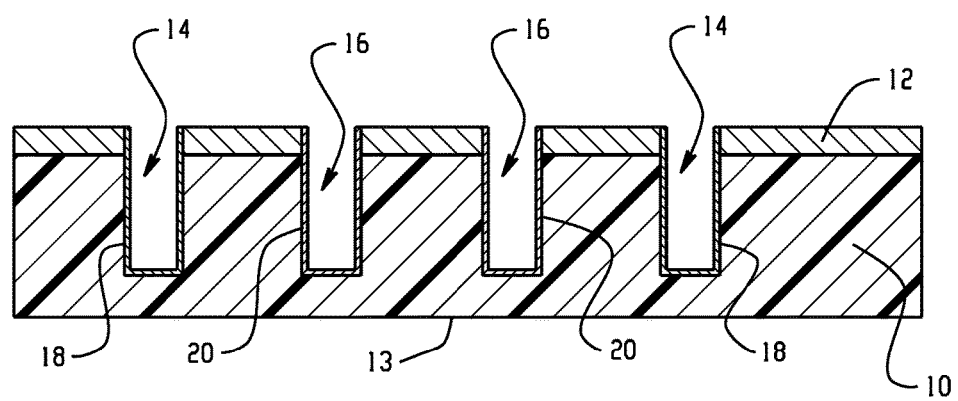
FIGS. 1-4 are cross-sectional views of a portion of a substrate at successive fabrication stages of a processing method for forming a structure with one or more thermoelectric cooling structures in accordance with an embodiment of the invention.

With reference to FIG. 1 and in accordance with an embodiment of the invention, a substrate 10 may be any suitable bulk substrate comprising a single-crystal semiconductor material that a person having ordinary skill in the art would recognize as suitable for forming an integrated circuit. For example, substrate 10 may be a wafer comprised of a monocrystalline silicon-containing material, such as single crystal silicon with a (100) crystal lattice orientation. The semiconductor material comprising substrate 10 may be comprised of extrinsic semiconductor material or, alternatively, may be lightly doped with an impurity to alter its electrical properties, and may also include an optional epitaxial layer. In an alternative embodiment, the substrate 10 may be a semiconductor-on-insulator (SOI) substrate. One or more integrated circuits may be formed in an active device level 12 at the front side of the substrate 10 by fabricating constituent devices using front-end-of-line (FEOL) processing. After device structures are fabricated in product chips using the substrate 10, a dicing operation is applied to produce multiple die.

Trenches 14, 16 are formed that penetrate through the active device level 12 at the front side of the substrate 10 and to a given depth into the substrate 10 toward a back side 13 of the substrate 10 that is opposite to the front side including the active device level 12. The trenches 14, 16 may be fabricated by reactive ion etching (e.g., a Bosch process) in the presence of an etch mask or by a different type of process, such as laser drilling.

A dielectric layer 18 may be applied as a liner inside of the trenches 14 and may comprise an organic or inorganic dielectric material that is an electrical insulator characterized by an electrical resistivity at room temperature of greater than $10^{10}$ ($\Omega$-m). In an embodiment, the dielectric layer may be comprised of silicon dioxide deposited by, for example, plasma-enhanced chemical vapor deposition. A mask (not shown) may be applied on regions of the substrate 10, including the regions that include trenches 16, to block deposition. The mask may be comprised of a layer of a light-sensitive material, such as an organic photoresist, that may be applied as a fluid by a spin coating process, pre-baked, exposed to light projected through a photomask, baked after exposure, and developed with a chemical developer. The etch mask may be subsequently removed in a lift-off process.

A dielectric layer 20, which has a different composition than dielectric layer 18, may be applied as a liner inside of the trenches 16. A mask (not shown) may be applied on regions of the substrate 10, including the regions that include trenches 14, to block deposition. The mask may be comprised of a layer of a light-sensitive material, such as an organic photoresist, that may be applied as a fluid by a spin coating process, pre-baked, exposed to light projected through a photomask, baked after exposure, and developed with a chemical developer. The etch mask may be subsequently removed in a lift-off process.

The dielectric layer 20 may be comprised of a dielectric material having a high thermal conductivity and a low electrical conductivity. The dielectric material comprising the dielectric layer 20 may be an electrical insulator characterized by an electrical resistivity at room temperature of greater than $10^{10}$ $\Omega$-m. However, the dielectric material comprising the dielectric layer 20 has a higher thermal conductivity than the thermal conductivity of the electrical insulator constituting the dielectric layer 18. In an embodiment, the dielectric material of the dielectric layer 20 may be aluminum nitride (AlN) or beryllium oxide (BeO) deposited by, for example, metal organic chemical vapor deposition (MOCVD). As an exemplary comparison illustrating the contrast, aluminum nitride comprising the dielectric layer 20 has a nominal thermal conductivity of approximately 285 W/m/K, whereas silicon dioxide comprising the dielectric layer 18 has a nominal thermal conductivity of approximately 1.4 W/m/K (i.e., greater than two orders of magnitude smaller than the thermal conductivity of aluminum nitride).

Figure 2:
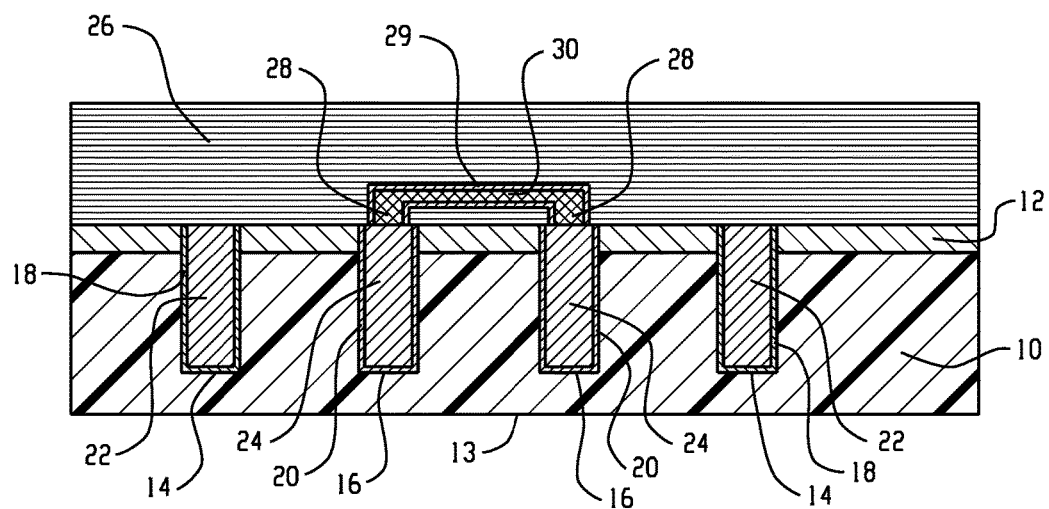

With reference to FIG. 2 in which like reference numerals refer to like features in FIG. 1 and at a subsequent fabrication stage, electrically-conducting through-silicon vias 22, 24 are respectively formed inside of the trenches 14, 16. The through-silicon vias 22, 24 may be comprised of copper deposited by, for example, depositing a barrier layer and a copper seed layer by physical vapor deposition or chemical vapor deposition inside the via and plating copper with an electrochemical process such as electroplating. The barrier layer, which may function as a diffusion barrier, may be comprised of titanium (Ti), titanium nitride (TiN), tungsten (W), tungsten nitride (WN), or a multilayer combination of these and other materials.

It should also be understood that, while a TSV is usually referred to as a "through-silicon" via because it may extend through a substrate comprising silicon, a TSV may in fact extend through materials that do not include silicon. Even in this latter case, a TSV may still be referred to by a person skilled in the art as a "through-silicon via" even though it may extend through materials other than silicon. Alternatively, a TSV may be referred to as a "through-semiconductor via", a "through-substrate via", or more simply a "through via".

Middle-of-line (MOL) and back-end-of-line (BEOL) processing follows to respectively form a local interconnect structure and a BEOL interconnect structure, generally indicated by reference numeral 26, on the substrate 10. The BEOL interconnect structure 26 is coupled with the integrated circuits formed using the substrate 10. The BEOL interconnect structure 26 may be comprised of a plurality of interconnected wiring levels that supply conductive paths for signals, clock, power, etc. In particular, the BEOL interconnect structure 26 may include contacts 28 and a wire 30 that is coupled by the contacts 28 with the through-silicon vias 24, which provides an electrically-conductive path connecting the adjacent pair of through-silicon vias 24. The openings in which the contacts 28 are situated and/or the trench in which the wire 30 is situated may be lined with a dielectric layer 29 that, similar to dielectric layer 20, may be comprised of a dielectric material having a high thermal conductivity and a low electrical conductivity.

Figure 3:
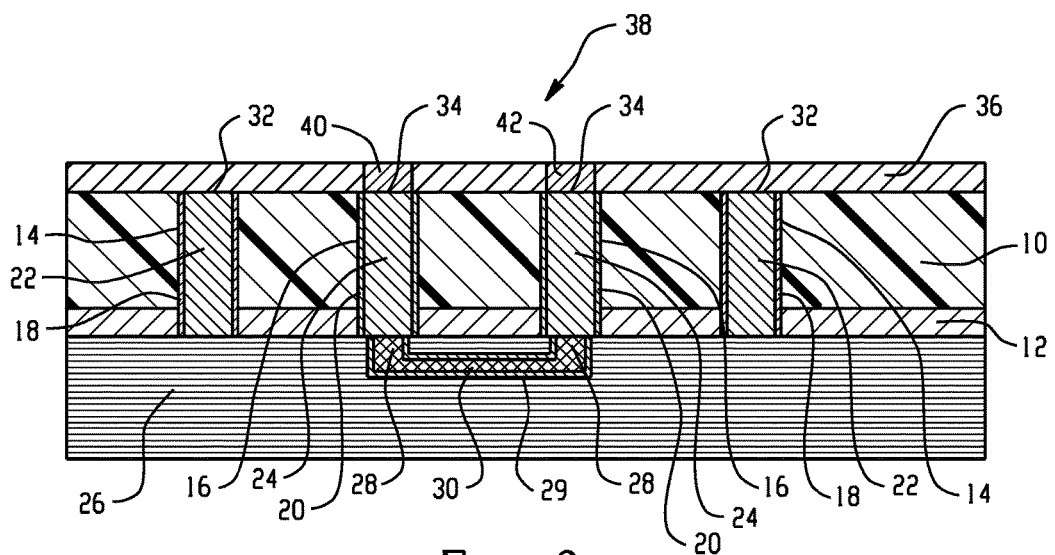

With reference to FIG. 3 in which like reference numerals refer to like features in FIG. 2 and at a subsequent fabrication stage, tips 32, 34 of the respective through-silicon vias 22, 24 may be subsequently exposed as part of a via-reveal process. To that end, the substrate 10 may be thinned from its back side 13 (i.e., non-device side) by grinding and/or wet or dry etching to reduce its original thickness and thereby expose the tips 32, 34. The through-silicon vias 22, 24 provide continuous electrically and thermally conductive paths between opposite front and back sides of the thinned substrate 10, and are fully embedded in the substrate 10. The through-silicon vias 22 may function to carry signals, power, and/or ground through its continuous conductive paths. In contrast, the through-silicon vias 24 may function to collect heat energy from the substrate 10 that is generated when the integrated circuits are powered and operating.

A dielectric layer 36 is formed on the back side 13 of the substrate 10 and is patterned with an etch mask and reactive ion etching to define openings that coincide spatially with the locations of the through-silicon vias 24. The openings extend through the thickness of the dielectric layer 36 and are sized to expose at least a portion of the surface area of the tips 34 of the through-silicon vias 24. In an embodiment, the full surface area of the tips 34 of the through-silicon vias 24 is exposed through the openings in the dielectric layer 36. In other embodiments, the openings in the dielectric layer 36 may be larger or smaller than the full surface area of the tips 34 of the through-silicon vias 24.

A thermoelectric couple, generally indicated by reference numeral 38, is formed using the openings in the dielectric layer 36 at the back side 13 of the substrate 10. In one of the openings, an n-type pillar 40 is formed that is comprised of an n-type thermoelectric material, such as n-type bismuth telluride ($Bi_2Te_3$) or n-type lead telluride (PbTe). A temporary mask can be applied to cover the other opening in the dielectric layer 36 while the n-type pillar 40 is formed. In the other opening, a p-type pillar 42 is formed in the other opening in the dielectric layer 36. The p-type pillar 42 can be comprised of a p-type thermoelectric material, such as p-type bismuth telluride or p-type lead telluride.

The pillars 40, 42 may have the same shape and/or size as the through-silicon vias 24. For example, if the through-silicon vias 24 are round and circular in cross-section, the pillars 40, 42 may likewise be round and circular in cross-section. As another example, if the through-silicon vias 24 are bars with rectangular shape in cross-section, the pillars 40, 42 may likewise be bars with rectangular shape in cross-section. As another example, the surface of the pillars 40, 42 in contact with the respective exposed surfaces of the through-silicon vias 24 at their the tips 34 may be larger or smaller in surface area.

Figure 4:
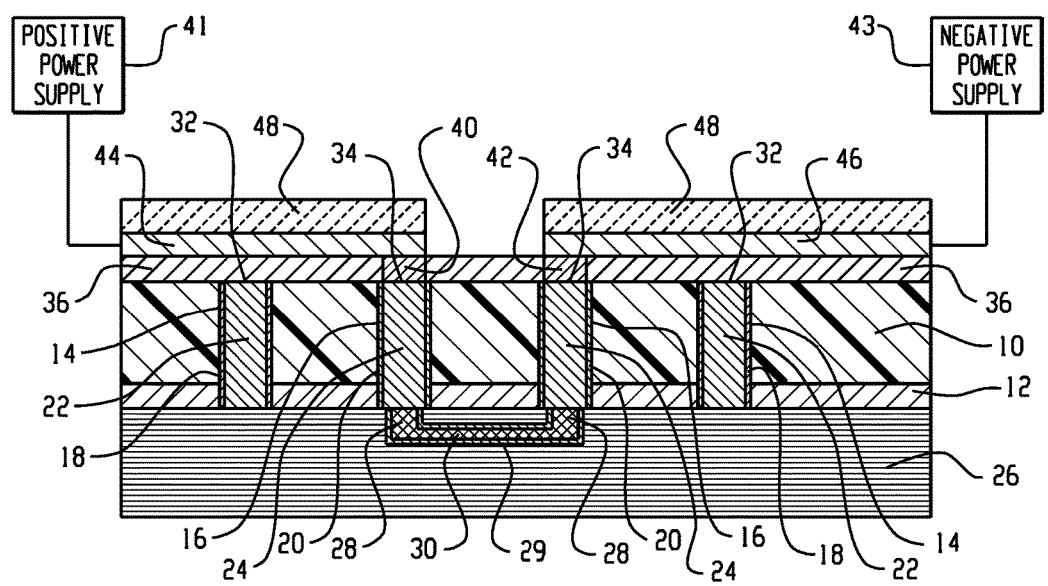

With reference to FIG. 4 in which like reference numerals refer to like features in FIG. 3 and at a subsequent fabrication stage, wires 44, 46 may be formed as back side metallization at the back side 13 of the substrate 10 by deposition, polishing, lithography, and etching techniques characteristic of a damascene process. Candidate conductors for the wires 44, 46 are metals such as copper (Cu) and aluminum (Al). Wire 44 is coupled with the n-type pillar 40 and may couple the n-type pillar 40 with an adjacent p-type pillar (not shown). Wire 46 is coupled with p-type pillar 42 and may couple the p-type pillar 42 with an adjacent n-type pillar (not shown). As a result, the wires 44, 46 may provide a series connection with other thermoelectric couples like thermoelectric couple 38 that are formed at the back side 13 of the substrate 10 and that are coupled with additional through-silicon vias like through-silicon vias 22.

A layer 48 of a heat sink ceramic is applied to the wires 44, 46 and provides a thermally conductive path from the wires 44, 46 to the surrounding environment. The heat sink ceramic layer 48 may be comprised of a dielectric material having a high thermal conductivity and a low electrical conductivity. For example, the heat sink ceramic layer 48 may be comprised of aluminum nitride or beryllium oxide deposited by, for example, metal organic chemical vapor deposition.

Heat energy, and in particular heat energy generated by the active device level 12, is extracted from the substrate 10 by the operation of the thermoelectric couple 38 and is conducted from the wires 44, 46 through the heat sink ceramic layer 48 and dissipated to the surrounding environment. The heat energy originates from the one or more integrated circuits in the active device level 12 at the front side of the substrate 10 and/or the BEOL interconnect structure 26 at the front side of the substrate 10. With respect to the BEOL interconnect structure 26, the dielectric layer 29 surrounding the contacts and/or wire 30 may promote the absorption of heat energy from the BEOL interconnect structure 26 and/or the one or more integrated circuits. With respect to the through-silicon vias 24, the dielectric layer 20 surrounding the through-silicon vias 24 may promote the absorption of heat energy from the BEOL interconnect structure 26 and/or the one or more integrated circuits.

The n-type pillar 40 may be coupled with a positive power supply 41 through a conductive path including the wire 44. The p-type pillar 42 can be coupled with a negative power supply 43 through an independent conductive path including the wire 46. The connections with the power supplies 41, 43 can be made from the back side 13 of the substrate 10. When powered by the power supplies 41, 43, the thermoelectric couple 38 is operational. It is understood that additional thermoelectric couples may be located between wire 44 and the positive power supply 41 and/or between wire 46 and the negative power supply 43. It is also understood that the power supplies 41, 43 may be consolidated into a single power supply.

In use, through-silicon vias 24 collect and absorb heat energy generated by the devices of the integrated circuits in the active device level 12 at the front side of the substrate 10 when the chip is powered and operating. The wire 30 also collects and absorbs heat energy generated in the wiring levels of the BEOL interconnect structure 26 at the front side of the substrate 10 and directs that heat to the through-silicon vias 24 to which it is coupled. The absorbed heat energy is spontaneously conducted through the through-silicon vias 24 toward the back side 13 of the substrate 10. The through-silicon vias 24 may also be at a lower temperature than the substrate 10. The electrons moving in the electrical current path through the thermoelectric couple 38 promote the transfer of heat out of the substrate 10, which is absorbed by the heat sink ceramic layer 48 for dissipation into the surrounding environment.

Through-silicon vias 22 are not in the electrical or thermal current path of the thermoelectric couple 38. Moreover, the dielectric liner 18 provides a level of thermal insulation between the through-silicon vias 22 and the substrate 10, which significantly reduces the amount of heat absorbed by the through-silicon vias 22.

Figure 5:
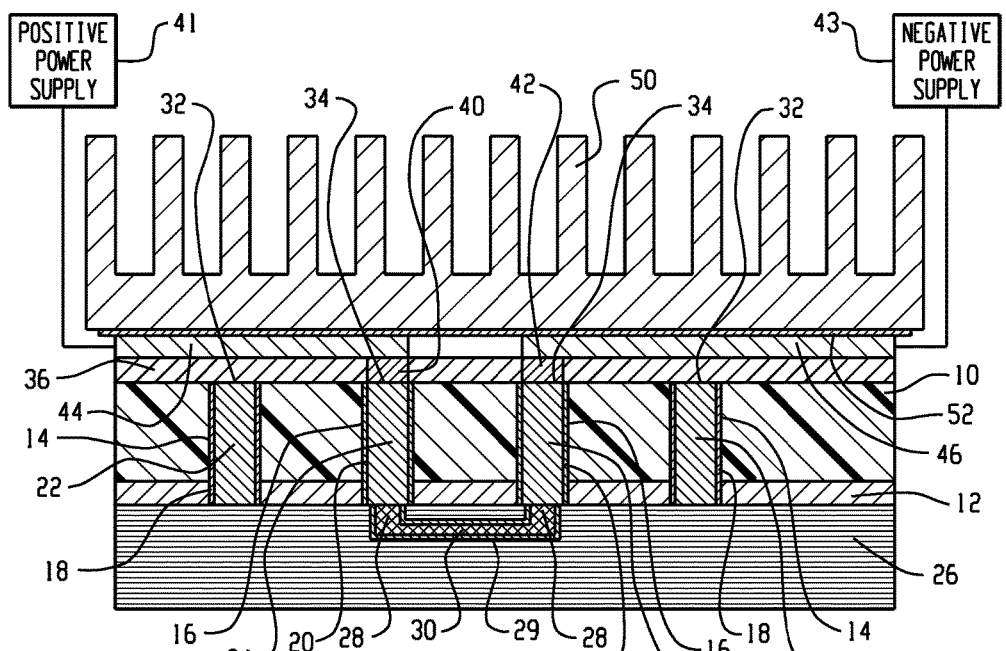
FIGS. 5 and 6 are cross-sectional views similar to FIG. 4 of structures that have been fabricated in accordance with alternative embodiments of the invention.

With reference to FIG. 5 in which like reference numerals refer to like features in FIG. 4 and in accordance with an alternative embodiment of the invention, the heat sink ceramic layer 48 may be replaced by a heat sink 50 that is coupled with the wires 44, 46 by a thermal interface material layer 52. The heat sink 50 may have a large thermal capacity and with a large surface area relative to its volume, and may be made of a metal (e.g., aluminium or copper) with high thermal conductivity. In the representative embodiment, the heat sink 50 includes multiple fins that increase the surface area providing heat dissipation to the surrounding environment. The thermal interface material layer 52 may be comprised of a thermal adhesive, a thermal grease, a thermal gel, a phase change material, a thermal pad, or a combination thereof. The thermal interface material layer 52 may be effective to reduce the contact resistance by filling small air gaps located between imperfectly flat and smooth the mating surfaces, and may also function as a heat spreader.

Figure 6:
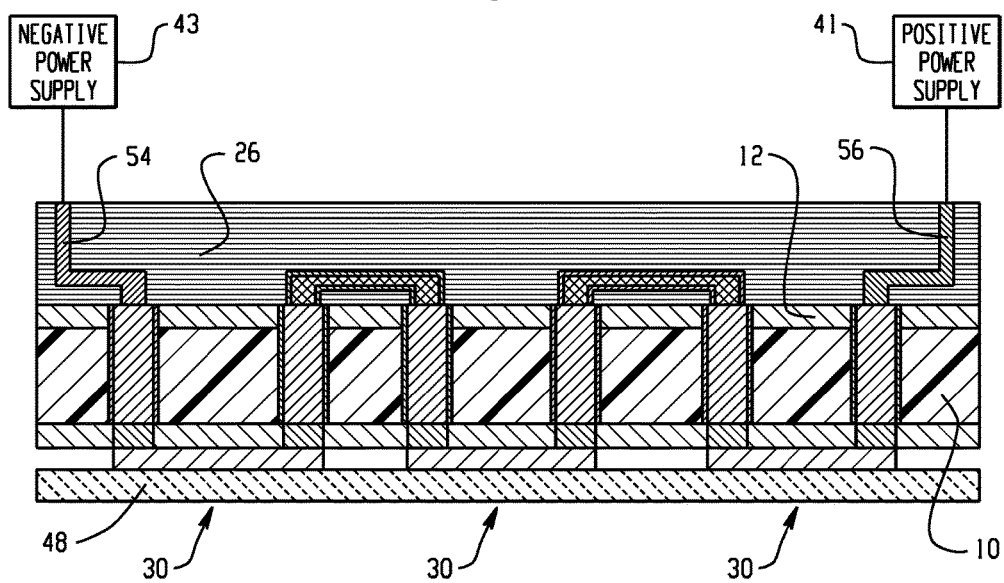

With reference to FIG. 6 in which like reference numerals refer to like features in FIG. 4 and in accordance with an alternative embodiment of the invention, multiple thermoelectric couples 30 are daisy-chained together with wires that are similar to wires 44, 46 in a series electrical connection. The thermoelectric couples 30 may be powered from the front side 12 of the substrate 10, instead of the back side 13 of the substrate 10, using conductive paths 54, 56 comprised of vias and/or wires in the BEOL interconnect structure 26. The positive power supply 41 may be coupled by the conductive paths 54, 56 with the thermoelectric couple 30 at one terminal end of the daisy chain, and the negative power supply 43 may be coupled with the thermoelectric couple 30 at the opposite terminal end of the daisy chain. For purposes of illustration, the through-silicon vias 22 are omitted from the view in FIG. 6.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip structure (e.g., a plastic carrier, with leads that are affixed to a motherboard or other higher level carrier) or in a multichip structure (e.g., a ceramic carrier that has either or both surface interconnections or buried interconnections). In any case, the chip is then integrated with other chips, discrete circuit elements, and/or other signal processing devices as part of either an intermediate product, such as a motherboard, or an end product. The end product can be any product that includes integrated circuit chips, such as computer products having a central processor or smartphones.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure formed using a substrate having a front side and a back side opposite from the front side, the structure comprising:
    a device level at the front side of the substrate;
    a first thermoelectric couple coupled with the substrate, the first thermoelectric couple including a first through-silicon via in a first trench extending through the device level and the substrate to the back side of the substrate, a second through-silicon via in a second trench extending through the device level and the substrate to the back side of the substrate, an n-type thermoelectric pillar coupled with the first through-silicon via, and a p-type thermoelectric pillar coupled with the second through-silicon via;
    a third through-silicon via in a third trench extending through the device level and the substrate;
    a first liner comprised of a first dielectric material arranged in the first trench between the substrate and the first through-silicon via and arranged in the second trench between the substrate and the second through-silicon via;
    a second liner arranged in the third trench between the substrate and the third through-silicon via; and
    a back-end-of-line (BEOL) interconnect structure at the front side of the substrate, the BEOL interconnect structure including a wire that couples the first through-silicon via in series with the second through-silicon via,
    wherein the second liner is comprised of a second dielectric material having a thermal conductivity that is less than a thermal conductivity of the first dielectric material, and the first dielectric material is aluminum nitride.

2. A structure formed using a substrate having a front side and a back side opposite from the front side, the structure comprising:
    a device level at the front side of the substrate;
    a first thermoelectric couple coupled with the substrate, the first thermoelectric couple including a first through-silicon via in a first trench extending through the device level and the substrate to the back side of the substrate, a second through-silicon via in a second trench extending through the device level and the substrate to the back side of the substrate, an n-type thermoelectric pillar coupled with the first through-silicon via, and a p-type thermoelectric pillar coupled with the second through-silicon via;
    a first liner comprised of a first dielectric material arranged in the first trench between the substrate and the first through-silicon via and arranged in the second trench between the substrate and the second through-silicon via;
    a back-end-of-line (BEOL) interconnect structure at the front side of the substrate, the BEOL interconnect structure including a wire that couples the first through-silicon via in series with the second through-silicon via; and
    a dielectric layer applied to the back side of the substrate,
    wherein the first dielectric material is aluminum nitride, the n-type thermoelectric pillar and the p-type thermoelectric pillar are located at the back side of the substrate, the n-type thermoelectric pillar is located in a first opening extending through the dielectric layer to a tip of the first through-silicon via, and the p-type thermoelectric pillar is located in a second opening extending through the dielectric layer to a tip of the second through-silicon via.

3. The structure of claim 1 further comprising:
    a first wire coupled with the n-type thermoelectric pillar;
    a second wire coupled with the p-type thermoelectric pillar; and
    a heat sink coupled with the first wire and the second wire.

4. The structure of claim 3 wherein the first wire and the second wire are located between the heat sink and the back side of the substrate.

5. The structure of claim 3 wherein the heat sink is a heat sink ceramic layer.

6. The structure of claim 5 wherein the heat sink ceramic layer is comprised of aluminum nitride.

7. The structure of claim 1 further comprising:
    a first wire coupled with the n-type thermoelectric pillar;
    a second wire coupled with the p-type thermoelectric pillar; and
    a second thermoelectric couple daisy-chained in series with the first thermoelectric couple by either the first wire or the second wire.

8. The structure of claim 7 wherein the n-type thermoelectric pillar and the p-type thermoelectric pillar are located at the back side of the substrate.

9. The structure of claim 1 further comprising:
    a power supply; and
    a conductive path in the BEOL interconnect structure, the conductive path arranged to couple the power supply with the first through-silicon via at the front side of the substrate for supplying power to the n-type thermoelectric pillar or with the second through-silicon via at the front side of the substrate for supplying power to the p-type thermoelectric pillar.

10. The structure of claim 9 wherein the n-type thermoelectric pillar and the p-type thermoelectric pillar are located at the back side of the substrate.

11. A method comprising:
    forming a device level at a front side of a substrate that is opposite from a back side of the substrate;
    forming a first trench extending through the device level and the substrate to the back side of the substrate;
    forming a second trench extending through the device level and the substrate to the back side of the substrate;
    forming a third trench extending through the device level and the substrate to the back side of the substrate;
    forming a first liner comprised of a first dielectric material in the first trench and in the second trench;
    after forming the first liner in the first trench and in the second trench, forming a first through-silicon via in the first trench and a second through-silicon via in the second trench;
    forming a second liner comprised of a second dielectric material in the third trench;
    after the forming second liner in the third trench, forming a third through-silicon via in the third trench;
    depositing an n-type thermoelectric pillar coupled with the first through-silicon via;
    depositing a p-type thermoelectric pillar coupled with the second through-silicon via; and
    forming a back-end-of-line (BEOL) interconnect structure at the front side of the substrate,
    wherein the second dielectric material has a thermal conductivity that is less than a thermal conductivity of the first dielectric material, the BEOL interconnect structure includes a wire that couples the first through-silicon via in series with the second through-silicon via, and the first dielectric material is aluminum nitride.

12. The method of claim 11 wherein the n-type thermoelectric pillar and the p-type thermoelectric pillar are located at the back side of the substrate.

13. The method of claim 12 further comprising:
depositing a dielectric layer on the back side of the substrate;
forming a first opening extending through the dielectric layer to a tip of the first through-silicon via; and
forming a second opening extending through the dielectric layer to a tip of the second through-silicon via,
wherein the n-type thermoelectric pillar is located in the first opening and the p-type thermoelectric pillar is located in the second opening.

14. The method of claim 11 further comprising:
forming a first wire coupled with the n-type thermoelectric pillar;
forming a second wire coupled with the p-type thermoelectric pillar; and
depositing a heat sink ceramic layer on the back side of the substrate,
wherein the heat sink ceramic layer is coupled with the first wire and the second wire, and the first wire and the second wire are located between the heat sink ceramic layer and the back side of the substrate.

15. The method of claim 11 further comprising:
forming a conductive path in the BEOL interconnect structure that couples a power supply with the first through-silicon via for supplying power to the n-type thermoelectric pillar or the second through-silicon via for supplying power to the p-type thermoelectric pillar.

16. The structure of claim 1 wherein the second dielectric material is silicon dioxide.

17. The method of claim 11 wherein the second dielectric material is silicon dioxide.

18. The structure of claim 1 wherein the n-type thermoelectric pillar and the p-type thermoelectric pillar are located at the back side of the substrate.

19. The structure of claim 18 further comprising:
a dielectric layer applied to the back side of the substrate,
wherein the n-type thermoelectric pillar is located in a first opening extending through the dielectric layer to a tip of the first through-silicon via and the p-type thermoelectric pillar is located in a second opening extending through the dielectric layer to a tip of the second through-silicon via.

\* \* \* \* \*